United States Patent

Amano et al.

Patent Number: 5,453,582
Date of Patent: Sep. 26, 1995

[54] CIRCUIT BOARD TO BE PRECOATED WITH SOLDER LAYERS AND SOLDER CIRCUIT BOARD

[75] Inventors: Toshiaki Amano; Kazuhito Hikasa, both of Hiratsuka; Seishi Kumamoto, Kakogawa; Takahiro Fujiwara, Ono, all of Japan

[73] Assignees: The Furukawa Electric Co., Ltd., Tokyo; Harima Chemicals, Inc., Hyogo, both of Japan

[21] Appl. No.: 396,867

[22] Filed: Mar. 1, 1995

Related U.S. Application Data

[63] Continuation of Ser. No. 144,826, Oct. 29, 1993, abandoned.

[30] Foreign Application Priority Data

Mar. 11, 1993 [JP] Japan ................................ 5-076418

[51] Int. Cl.$^6$ .................................................. H05K 1/18
[52] U.S. Cl. ........................... 174/261; 174/260; 361/767; 361/771
[58] Field of Search ............................... 179/260, 259, 179/261; 361/767, 771, 777, 779, 808; 439/55, 68, 83; 228/180.21, 179.1; 29/840, 843

[56] References Cited

U.S. PATENT DOCUMENTS

| | | | |
|---|---|---|---|
| 3,770,874 | 11/1973 | Krieger et al. | 174/68.5 |
| 4,195,195 | 4/1980 | de Miranda et al. | 174/68.5 |
| 4,225,900 | 9/1980 | Ciccio et al. | 361/395 |
| 4,484,704 | 11/1984 | Grassauer | 228/180 A |
| 4,772,762 | 9/1988 | Fukino | 171/68.5 |
| 4,893,216 | 1/1990 | Hagner | 361/406 |
| 5,118,029 | 6/1992 | Fuse et al. | 228/98 |
| 5,145,532 | 9/1992 | Fukunaga et al. | 148/23 |

OTHER PUBLICATIONS

Izumi Kosuga et al., U.S. Patent Application No. 07/852,526 filed Mar. 17, 1992.

*Primary Examiner*—Leo P. Picard
*Assistant Examiner*—L. Thomas
*Attorney, Agent, or Firm*—John P. White

[57] ABSTRACT

A large number of pads, to which component leads are to be soldered, are formed on an insulating substrate so as to constitute a pad array. Colder layers are precoated on the pads. Each of the pads has a component lead mounting portion where a component lead is to be mounted, and a component lead non-mounting portion where no component lead is to be mounted. The component lead non-mounting portion includes a wide part having a width greater than that of the component lead mounting portion.

14 Claims, 3 Drawing Sheets

CIRCUIT BOARD TO BE PRECOATED WITH SOLDER LAYERS AND SOLDER CIRCUIT BOARD

This is a file wrapper continuation of application Ser. No. 08/144,826 filed Oct. 29, 1993 now abandoned.

BACKGROUND OF THE INVENTION

1. Field of the Invention

The present invention relates to a circuit board to be precoated with solder layers for allowing electronic components such as LSIs, which are provided with a large number of leads, to be mounted on the circuit board, and also relates to a solder precoated circuit board.

2. Description of the Related Art

When electronic components, the lead pitch of which is 0.5 mm or greater, are mounted on a printed circuit board, a method using solder paste is generally employed. In this method, each electronic component is mounted on the printed circuit board in which solder paste is printed on the pads thereof by means of a mounter; with the electronic component being positioned such that the leads are arranged on the pads. The printed circuit board, on which the electronic components have been mounted, is heated in a fellow furnace such that the solder paste is fused, thus soldering the leads and the pads to each other. Since the solder paste is adhesive, there is no risk of the electronic components being displaced during the processes which follow the mounting of the electric components.

Currently, electronic components such as LSIs have a tendency toward an increase in the number of leads. In contrast, there is a great request for reducing the sizes of the electronic components as much as possible in order to reduce the sizes of devices. Taking the above circumstances into consideration, the lead pitch of the electronic components is now being reduced. However, according to a conventional method utilizing the solder paste, when the lead pitch is reduced to the order of 0.3 mm, a large number of solder bridges are undesirably formed between the leads.

In consideration of the above-described drawback of the conventional method, solder precoating methods which do not use the solder paste such as the following two methods have been proposed:

(1) a method wherein solder is deposited on the pads by means of electrolytic plating or electroless plating, after which fusing (forming an alloy by fusing a plated layer) is performed; and (2) a method wherein a solder precipitating composition, which contains tin powder and organic acid lead salt as the main components, is coated, and a substitution reaction is caused between the tin powder and the organic acid lead salt so as to precipitate solder substantially only on the pads (U.S. Pat. No. 5,145,532).

In the case of the above methods, solder layers are formed on the pads before mounting of the electronic components. After flux is applied on the solder layers, the electronic components are mounted on the circuit board, and then heat is applied to the solder layers, thus mounting the electronic components.

Depending on the accuracy with which circuit patterns are formed, it undesirably happens that pads having different sizes are formed on the printed circuit board. When a predetermined amount of solder is precoated on the pads having different sizes, thick solder layers are formed on narrow pads, and thin solder layers are formed on wide pads.

In consideration of the above, where the pad width is great, the solder precoating conditions are determined so that solder layers having a thickness necessary for soldering can be formed. The solder precoating process is conducted under determined conditions. In this case, however, the solder is provided in surplus onto narrow pads resulting in solder blisters being formed partially on the pads.

Thus, according to the conventional precoating methods described above, it is difficult to form solder layers having uniform thickness on the pads.

If a component lead is mounted on a solder layer which is not uniform in thickness, that part of the lead which is placed on a thick portion of the solder layer will deform, with the result that an appropriate fillet cannot be formed in a later soldering process.

Also, when repairing fine-pitch component leads, it is very difficult to again provide solder onto a pad from which a component lead has been detached. Therefore it is preferred that mounting of components be performed again using the solder left on the pad. In order to facilitate this, a large amount of solder has to be precoated on the pad. However, when a large amount of solder is precoated, variation in the thickness of each solder layer is considerable, aggravating the above-described drawback.

SUMMARY OF THE INVENTION

It is an object of the present invention to provide a circuit board to be precoated with solder layers, wherein solder layers, which are precoated on conductive portions where the component leads are to be mounted, can be substantially uniform in thickness.

Another object of the present invention is to provide a solder precoated circuit board wherein the solder layers, precoated on conductive portions where the component leads are to be mounted, are substantially uniform in thickness.

According to one aspect of the present invention, there is provided a circuit board to be precoated with solder layers, the circuit board comprising a substrate and an array of conductive members which are formed on the substrate and on which solder layers are to be precoated for soldering component leads to the conductive members, wherein each of the conductive members has a component lead mounting portion where a component lead is to be mounted, and a component lead non-mounting portion where no component lead is to be mounted and which is continuous with the component lead mounting portion; and the component lead non-mounting portion includes a wide part having a width greater than that of the component lead mounting portion.

According to another aspect of the present invention, there is provided a solder precoated circuit board comprising a substrate; an array of conductive members formed on the substrate and to which component leads are to be soldered; and solder layers precoated on the conductive members; wherein each of the conductive members has a component lead mounting portion where a component lead is to be mounted, and a component lead non-mounting portion where no component lead is to be mounted and which is continuous with the component lead mounting portion; and the component lead non-mounting portion includes a wide part having a width greater than that of the component lead mounting portion.

By employing the above-described structures, a solder layer can be precoated on each conductive member such that the solder on the wide part of the component lead non-mounting portion of the conductive member is thicker than that on the remaining portion of the conductive member. Therefore, the place where a solder blister is formed can be limited to the wide part, ensuring uniform thickness of the solder layer on the component lead mounting portion of the conductive member.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

A solder precoated circuit board includes conductive members (pads, or the pads and portions continuous therewith) on which solder layers are precoated and which are formed narrow and long in correspondence with the component leads. Even if the conductive members have wide parts, solder layers precoated on the conductive members have uniform internal pressure in a fused state. As should be clear from the Laplace formula described later, since the solder pedestal on a wide part of each conductive member and that on a narrow part of the conductive member tend toward having the same radius of curvature, the solder layer on the wide part is thicker than that on the narrow part.

Therefore, when solder is supplied in surplus to the conductive members on which solder layers are to be precoated, a larger amount of solders is gathered on the wide parts rather than the narrow parts. Consequently, solder blisters are formed only on the wide parts, and solder layers having substantially uniform thickness are formed on the narrow parts.

The present invention is based on the above principle. To be specific, a component lead non-mounting portion of each conductive member where no component lead is to be mounted, is provided with a wide part having a width greater than that of the remaining portion of the conductive member, and a solder blister is positively formed on the wide part so that a solder layer having substantially uniform thickness is formed on a component lead mounting portion of the conductive member where a component lead is to be mounted.

After a component lead is placed on the solder layer thus formed, the solder layer is fused, causing a change in the internal pressure distribution within the solder layer. The solder, gathered on the wide part, flows toward the component lead such that a desired solder fillet is formed.

The present invention will now be described in more detail, with reference to the accompanying drawings.

Figure 1:
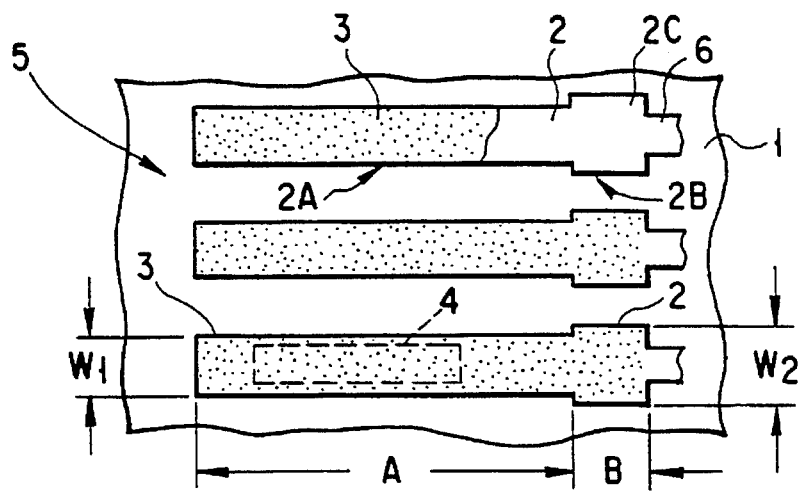
FIG. 1 is a plan view of the circuit board according to an embodiment of the present invention.
Figure 2:
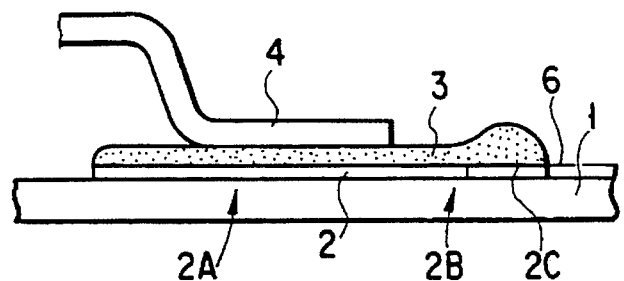
FIG. 2 is a side view of the circuit board shown in FIG. 1.

FIG. 1 is a plan view of the circuit board according to an embodiment of the present invention. FIG. 2 is a side view of the circuit board. In the drawings, reference numeral 1 denotes an insulating substrate on which a large number of pads 2 (conductive members), to which component leads are to be soldered, are formed so as to constitute a pad array 5. Solder layers 3 are precoated on the pads 2. It should be noted that reference numeral 6 denotes a wiring layer.

The pads 2 are narrow and long, and are formed by pattern-etching copper foil. Each of the pads has a component lead mounting portion 2A on which a component lead 4 is to be mounted, and a component lead non-mounting portion 2B on which no component lead is to be mounted. The component lead non-mounting portion 2B has a rectangular wide part 2C which has a width ($=W_2$) greater than the width ($=W_1$) of the component lead mounting portion 2A. The length of the wide part 2C of the pad 2 is B, while the length of the remaining narrow part of the pad is A.

Figure 3A:
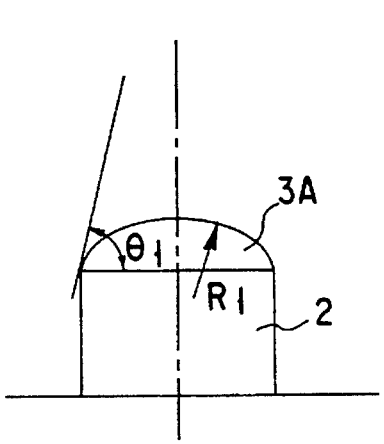
FIG. 3A is a diagram explaining the swelling state of the solder on a narrow part of the pad.
Figure 3B:
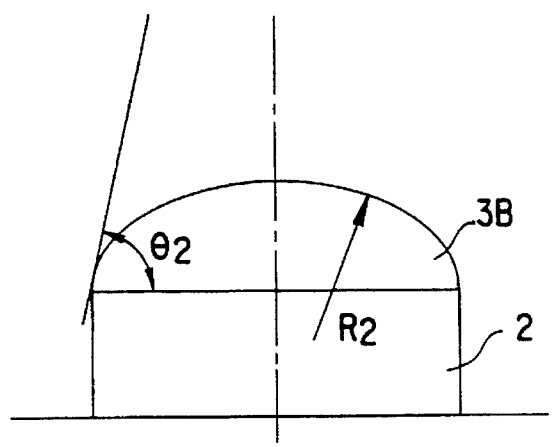
FIG. 3B is a diagram showing the swelling state of the solder on a wide part of the pad.

The swelling state of the solder layers 3, precoated on the pads 2 having the above-described shape, will now be explained with reference to FIGS. 3A and 3B. FIG. 3A shows the narrow part of the pad which includes the component lead mounting portion 2A. FIG. 3B shows the wide part 2C.

The radius of curvature of a solder pedestal 3A on the narrow part is represented by $R_1$ as shown in FIG. 3A, while the radius of curvature of a solder pedestal 3B on the wide part is represented by $R_2$ as shown in FIG. 3B. The relationship between $R_1$ and $R_2$ is given as $R_1 < R_2$.

The contact angle of the solder pedestal 3A and the narrow part of the pad 2 is $\theta_1$, while the contact angle of the solder pedestal 3B and the wide part of the pad 2 is $\theta_1$. The relationship between $\theta_2$ and $\theta_2$ is given as $\theta_1 = \theta_2$.

A pressure difference $\Delta P_1$ between the internal pressure of the fused solder on the narrow part and the atmospheric pressure, and a pressure difference $\Delta P_2$ between the internal pressure of the fused solder on the wide part and the atmospheric pressure, are represented as below, on the basis of the Laplace formula:

$\Delta P_1 = 2\gamma_1/R_1$ $\Delta P_2 = 2\gamma 1/R_2$ (wherein $\gamma_1$ is a constant which is determined depending on the substance)

In this case, the internal pressure is larger than the atmospheric pressure, and therefore the relationships $\Delta P_1 \geq 0$ and $\Delta P_2 \geq 0$ are obtained. Since the atmospheric pressure is uniform on any portion of the solder pedestals, a difference between internal pressure $P_1$ of the solder on the narrow part and internal pressure $P_2$ of the solder on the wide part is represented as below:

$$P_1 - P_2 = 2_{r1} (1/R_1 - 1/R_2) > 0 \qquad 5$$

From the above, the relationship $P_1 > P_2$ is derived.

According to this relationship, the internal pressure of the solder pedestal 3A on the narrow part having a smaller radius of curvature is greater than the internal pressure of the solder pedestal 3B on the wide part having a larger radius of curvature. Consequently, the solder on the narrow part is extruded to the wide part so as to eliminate the pressure difference. Since the amount of solder on the wide part increases, the radius of curvature of the wide part becomes small (the angle of contact $\theta_2$ becomes large), and the radius of curvature of the narrow part becomes large (the angle $\theta_1$ becomes small). In short, the degree of swelling of the solder on the wide part becomes great.

Although any kind of solder can be adopted in the present invention, the solder deposit composition described in U.S. Pat. No. 5,145,532 is preferred. The solder layers 3 are formed by a substitution reaction between a powder of a metal having the greatest ionization tendency among the solder alloy components or a powder of an alloy thereof, and the organic acid salt of the other metal or metals in the solder alloy.

The powder of a metal having the greatest ionization tendency among the metals constituting the solder alloy and an own organic acid salt of the other metal or metals, such as carboxylic acid salt, are mixed. This mixture in the form of paste, is applied on the pads 2, and is heated when needed. As a result, due to a difference in ionization tendency, a substitution reaction occurs between the metal constituting the powder and the metal ions contained in the organic acid salt, and a free metal which is partly liberated from the organic acid salt is precipitated in the form of a metal around the metal particles of the powder. This results in an alloy of the metals in the powder and in the organic acid salt being formed when a lead carboxylate, such as lead rosinate or lead acetate is used as the organic acid salt, and when tin powder is used as the powder of a metal having a great ionization tendency, Sn-Pb solder alloy is formed on the pads 2 by the above-described substitution reaction. In the case of such a solder precipitation composition, solder can be deposited substantially only on the pads. Therefore, even if the patterns are very fine, the solder layers can be formed with high accuracy. Also, even if the pitch of the arrangement of the pads is 0.5 mm or less, the solder layers can be formed within a short period of time without the bridges being formed.

Next, an explanation will be made on the result of the solder layers being formed on the pads having the shape shown in FIG. 1, with the dimensions of the pads being A=1.0 mm, B=0.2 mm, $W_1$=0.15 mm, and $W_2$=0.18 mm. A solder precipitating composition, containing tin powder and organic acid lead salt as the main components, was applied over a pad array in which a large number of pads having the above dimensions were arranged. Solder was precipitated substantially only on the respective pads so as to precoat the solder layers B on the pads.

Figure 4:
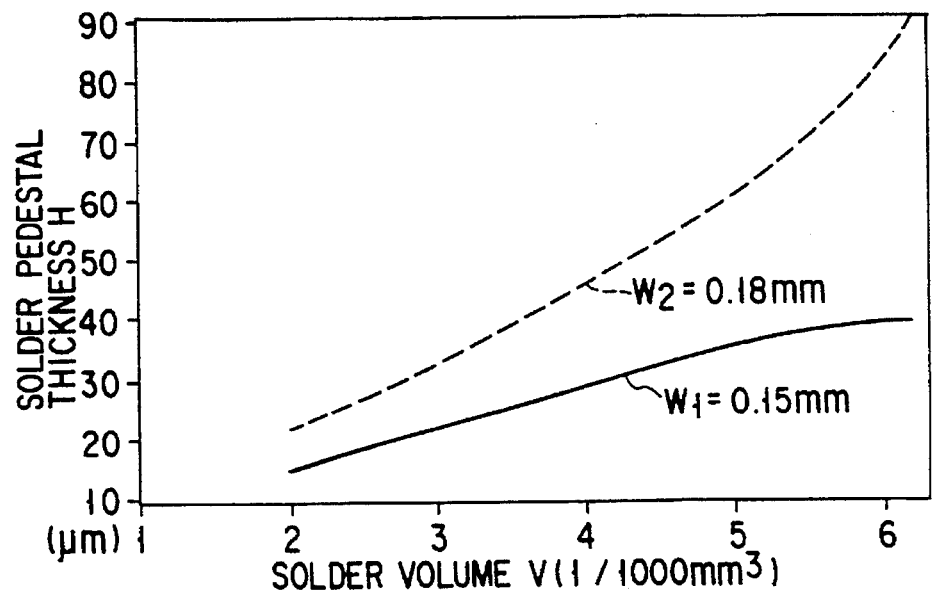
FIG. 4 is a graph showing the relationship between the amount of supply of solder and the thickness of a precoated solder layer in the case of different pad widths.

At that time, the amount of supply of solder was changed in order to check on the relationship between the amount of solder precipitated on a pad and the thickness of a solder layer formed on the pad. The relationship as obtained is shown in FIG. 4. It has been ascertained that, as can be seen in FIG. 4, the thickness of the solder on the wide part 2C increases rapidly as the amount of solder increases, while variations in the thickness of the solder layer on the narrow part 2A are small.

Thus, when a portion of the pad is provided with a wide part having a width greater than that of the remaining portion of the pad, the blister of solder occurs only on the wide part in the case where solder is supplied in surplus. Therefore, if a component lead non-mounting portion of the pad is provided with such a wide part, nonuniformity of thickness of the solder layer on a component lead mounting portion of the pad, can be suppressed. This eliminates the problem that deformation of a component lead occurs at the time of mounting of components due to the blister of solder, and therefore reliably ensures mounting of components. Further, since solder can be stocked in surplus on the wide part, the solder can be supplied at the time of repairing components from the wide part to a portion of the pad where a component lead is to be mounted. Thus, the pad with the solder layer can sufficiently meet the solder requirements when repairing components.

In the present invention, it suffices that a component lead non-mounting portion of the pad is provided with a wide part having a width greater than that of a component lead mounting portion of the pad where a component lead is to be mounted. The shape and arrangement of pads are not restricted.

Figure 5A:
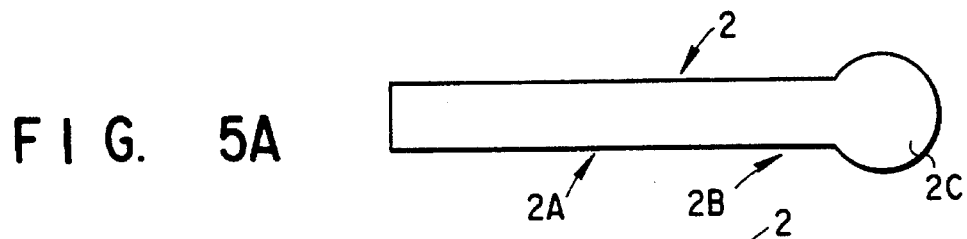
FIGS. 5A–5E are diagrams showing modifications of the pad.
Figure 5B:
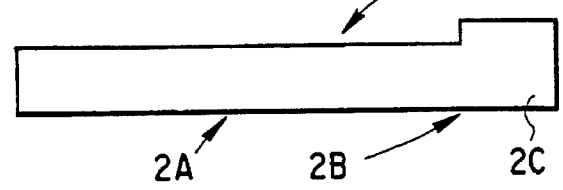

For example, as shown in FIG. 5A, the wide part 2C of a component lead non-mounting portion 2B of the pad 2 may be circular. As shown in FIG. 5B, the pad may have a shape in which a surface of the wide part 2C is flush with a surface of a portion of the component lead mounting portion, and the opposite surface of the wide part 2C projects beyond the corresponding surface of the portion of the component lead mounting portion.

Figure 5C:
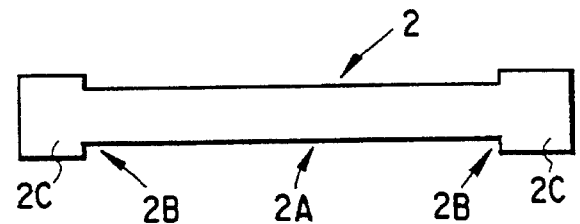
Figure 5D:
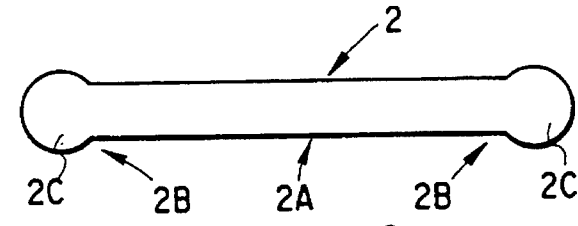
Figure 5E:
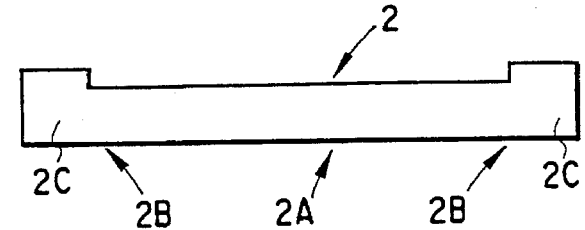

Further, as shown in FIGS. 5C–5E, the pad may have a shape wherein component lead non-mounting portions 2B, which are located on both sides of the portion 2A where a lead component is to be mounted, are provided with the wide part 2C.

Figure 6:
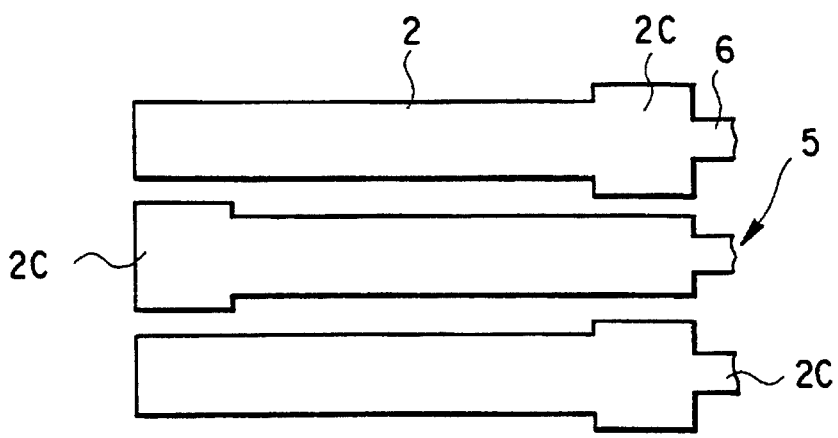
FIG. 6 is a diagram showing a modification of a pad array.

Moreover, as shown in FIG. 6, a plurality of pads 2 can be arranged in a staggered fashion. Since the wide parts of the pads thus arranged do not overlap each other, a finer pitch pad array can be formed.

Figure 7A:
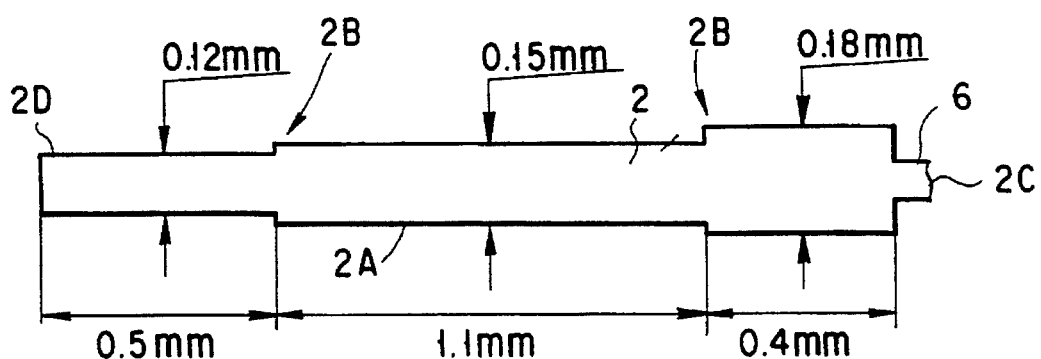
FIG. 7A is a diagram showing another modification of the pad.
Figure 7B:
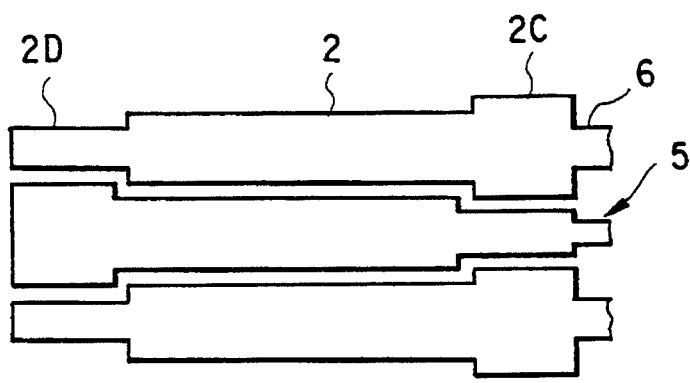
FIG. 7B is a diagram showing a pad array in which the pad shown in FIG. 7A is arranged plurally.

Furthermore, it is also possible that, as shown in FIG. 7A, one of component non-mounting portions 2B, which are formed on both sides of the pad 2, is provided with the wide part 2C. The other non-mounting portion 2B is provided with a part 2D having a width less than that of the component mounting portion 2A. These pads are arranged plurally in a staggered manner so as to form a pad array, as shown in FIG. 7B. When the pads are arranged as above, the narrowest part 2D of each pad and the wide part 2C of an adjacent pad are located side by side. Therefore, an array of pads can be formed with finer patterns.

In an example of the pad size in the case where the pads are arranged as above, the component mounting portion 2A of each pad 2 has a length of 1.1 mm and a width of 0.15 mm, the wide part 2C has a length of 0.4 mm and a width of 0.18 mm, and the narrowest part 2D has a length of 0.5 mm and a width of 0.12 mm, as shown in FIG. 7A. By employing these dimensions, the pitch between the pads can be reduced to 0.3 mm.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A circuit board to be precoated with solder layers, comprising:

a substrate; and an array of conductive members formed on said substrate and on which solder layers are to be precoated for soldering component leads to said conductive members;

wherein each of said conductive members has a component lead mounting portion where a component lead is to be mounted, a component lead non-mounting portion where no component lead is to be mounted and which is continuous with said component lead mounting portion, and another component lead non-mounting portion located opposite to said component lead non-mounting portion;

said component lead non-mounting portion includes a wide part having a width greater than that of said component lead mounting portion and said another component lead non-mounting portion includes a narrow part having a width less than that of said component lead mounting portion; and said conductive members are arranged with a wide part of each conductive member and a narrow part of an adjacent conductive member, being located side by side.

2. The circuit board according to claim 1, wherein said wide part of said component lead non-mounting portion is rectangular.

3. The circuit board according to claim 2, wherein said wide part of said component lead non-mounting portion has first and second surfaces facing each other, said first surface being flush with one surface of said component lead mounting portion, and said second surface projecting beyond another surface of said component lead mounting portion which is proximate to said second surface.

4. The circuit board according to claim 1, wherein said wide part of said component lead non-mounting portion is circular.

5. The circuit board according to claim 1, wherein the conductive members forming said array are arranged without wide parts of each adjacent pair of conductive members overlapping each other.

6. A solder precoated circuit board comprising:

a substrate;

an array of conductive members formed on said substrate and to which component leads are to be soldered; and a solder layer precoated on said conductive members;

wherein each of said conductive members has a component lead mounting portion where a component lead is to be mounted, a component lead non-mounting portion where no component lead is to be mounted and which is continuous with said component lead mounting portion, and another component lead non-mounting portion located opposite to said component lead non-mounting portion;

said component lead non-mounting portion includes a wide part having a width greater than that of said component lead mounting portion and said another component lead non-mounting portion includes a narrow part having a width less then that of said component lead mounting portion; and said conductive members are arranged with a wide part of each conductive member and a narrow part of each conductive member being located side by side.

7. The circuit board according to claim 6, wherein said wide part of said component lead non-mounting portion is rectangular.

8. The circuit board according to claim 7, wherein said wide part of said component lead non-mounting portion has first and second surfaces facing each other, said first surface being flush with one surface of said component lead mounting portion, and said second surface projecting beyond another surface of said component lead mounting portion which is proximate to said second surface.

9. The circuit board according to claim 6, wherein said wide part of said component lead non-mounting portion is circular.

10. The circuit board according to claim 6, wherein the conductive members forming said array are arranged without wide parts of each adjacent pair of conductive members overlapping each other.

11. The circuit board according to claim 6, wherein said solder layer is formed by a substitution reaction between a powder of a metal which has the greatest ionization tendency among components of a solder alloy or a powder of an alloy thereof, and organic acid salt of the other metal or metals in said solder alloy.

12. The circuit board according to claim 11, wherein said solder layer is made of Sn-Pb alloy which is formed by a substitution reaction between organic acid lead and tin powder.

13. A circuit board comprising:

a substrate; and an array of conductive members formed on said substrate such that a wide part of each said conductive member and a narrow part of an adjacent said conductive member are arranged to be located side by side;

each of said conductive members having:

(a) a component lead mounting portion having a first width where a component lead is mounted;

(b) a first component lead non-mounting portion having a wide part of a second width where said component lead is not mounted, said first component lead non-mounting portion is continuous with said component lead mounting portion; and (c) a second component lead non-mounting portion having a wide part of a third width where said component lead is not mounted, said second component lead non-mounting portion located opposite to said first component lead non-mounting portion;

such that said first width is narrower than said second width and said first width is narrower than said third width.

14. A circuit board according to claim 13, further comprising:

a solder layer precoated on said conductive elements.

* * * * *